United States Patent
Kim et al.

(10) Patent No.: US 9,761,832 B2
(45) Date of Patent: Sep. 12, 2017

(54) SUBSTRATE FOR ORGANIC ELECTRONIC DEVICE

(71) Applicant: LG DISPLAY CO., LTD., Seoul (KR)

(72) Inventors: Ji Hee Kim, Daejeon (KR); Hang Ah Park, Daejeon (KR); Sang Jun Lee, Daejeon (KR); Hye Won Jeong, Daejeon (KR); Jung Hyoung Lee, Daejeon (KR); Bo Ra Shin, Daejeon (KR); Mi Ra Im, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/784,475

(22) PCT Filed: Sep. 30, 2014

(86) PCT No.: PCT/KR2014/009240
§ 371 (c)(1),
(2) Date: Oct. 14, 2015

(87) PCT Pub. No.: WO2015/047055
PCT Pub. Date: Apr. 2, 2015

(65) Prior Publication Data
US 2016/0056411 A1    Feb. 25, 2016

(30) Foreign Application Priority Data
Sep. 30, 2013  (KR) .................. 10-2013-0116617
Sep. 30, 2014  (KR) .................. 10-2014-0131911

(51) Int. Cl.
*H01L 51/00* (2006.01)
*H01L 51/52* (2006.01)
*C08L 79/08* (2006.01)

(52) U.S. Cl.
CPC .......... *H01L 51/5253* (2013.01); *C08L 79/08* (2013.01); *H01L 51/0035* (2013.01);
(Continued)

(58) Field of Classification Search
None
See application file for complete search history.

(56) References Cited

U.S. PATENT DOCUMENTS

| | | | |
|---|---|---|---|
| 4,720,432 | A | 1/1988 | VanSlyke et al. |
| 6,226,890 | B1 | 5/2001 | Boroson et al. |

(Continued)

FOREIGN PATENT DOCUMENTS

| | | |
|---|---|---|
| CN | 1927908 A | 3/2007 |
| CN | 102097595 A | 6/2011 |

(Continued)

OTHER PUBLICATIONS

Oxford Instruments, "Aluminium Oxide (Al2O3) Atomic Layer Deposition (ALD)", downloaded from URL<https://www.oxford-instruments.com/products/etching-deposition-and-growth/processes/deposition-processes/metal-oxides/Al2O3-deposition> on Nov. 16, 2016.*

(Continued)

*Primary Examiner* — Joseph Schoenholtz
(74) *Attorney, Agent, or Firm* — Dentons US LLP

(57) ABSTRACT

Provided are a substrate for an organic electronic device (OED) and a use thereof. The substrate may have excellent interfacial cohesive property by preventing interlayer delamination between the organic material layer and the inorganic material layer when being applied to manufacture a flexible device including a structure in which an organic material layer and an inorganic material layer are present together. In addition, when the substrate for an OED is used, an OED may have excellent durability and an excellent another required physical property such as light extraction efficiency.

20 Claims, 1 Drawing Sheet

(52) U.S. Cl.
CPC ...... *H01L 51/0043* (2013.01); *H01L 51/0097* (2013.01); *H01L 51/5262* (2013.01); *H01L 2251/5338* (2013.01); *Y02E 10/549* (2013.01)

(56) References Cited

U.S. PATENT DOCUMENTS

| | | | |
|---|---|---|---|
| 6,808,828 B2 | 10/2004 | Ohata | |
| 9,449,809 B2* | 9/2016 | Choi | |
| 2003/0104232 A1* | 6/2003 | Kihara | C08G 73/10 428/473.5 |
| 2005/0285510 A1 | 12/2005 | Han et al. | |
| 2007/0275181 A1 | 11/2007 | Carcia et al. | |
| 2008/0182101 A1* | 7/2008 | Carcia | C23C 16/403 428/332 |
| 2009/0258211 A1* | 10/2009 | Yoshinaga | C08G 73/1039 428/220 |
| 2010/0140705 A1 | 6/2010 | Wu et al. | |
| 2011/0121355 A1 | 5/2011 | Bae et al. | |
| 2011/0143132 A1 | 6/2011 | Jung et al. | |
| 2011/0196109 A1 | 8/2011 | Cho et al. | |
| 2012/0187399 A1* | 7/2012 | Fukuda | H01L 29/78603 257/43 |
| 2012/0217535 A1 | 8/2012 | Van De Weijer et al. | |
| 2015/0225523 A1* | 8/2015 | Suenaga | C08G 73/1039 428/435 |

FOREIGN PATENT DOCUMENTS

| | | |
|---|---|---|
| CN | 102137884 A | 7/2011 |
| CN | 102576735 A | 7/2012 |
| JP | 2-88689 A | 3/1990 |
| JP | 2-191694 A | 7/1990 |
| JP | 2-196885 A | 8/1990 |
| JP | 2-250292 A | 10/1990 |
| JP | 2-255789 A | 10/1990 |
| JP | 2-289676 A | 11/1990 |
| JP | 3-296595 A | 12/1991 |
| JP | 4-96990 A | 3/1992 |
| JP | 5-9470 A | 1/1993 |
| JP | 5-17764 A | 1/1993 |
| JP | 5-202011 A | 8/1993 |
| JP | 6-49079 A | 2/1994 |
| JP | 6-88072 A | 3/1994 |
| JP | 6-92947 A | 4/1994 |
| JP | 6-100857 A | 4/1994 |
| JP | 6-107648 A | 4/1994 |
| JP | 6-132080 A | 5/1994 |
| JP | 6-145146 A | 5/1994 |
| JP | 6-203963 A | 7/1994 |
| JP | 6-206865 A | 7/1994 |
| JP | 6-207170 A | 7/1994 |
| JP | 6-279322 A | 10/1994 |
| JP | 6-279323 A | 10/1994 |
| JP | 6-293778 A | 10/1994 |
| JP | 7-157473 A | 6/1995 |
| JP | 7-179394 A | 7/1995 |
| JP | 7-207023 A | 8/1995 |
| JP | 7-228579 A | 8/1995 |
| JP | 7-278124 A | 10/1995 |
| JP | 8-22557 A | 1/1996 |
| JP | 8-81472 A | 3/1996 |
| JP | 2597377 B2 | 4/1997 |
| JP | 2000-145627 A | 5/2000 |
| JP | 2001-252505 A | 9/2001 |
| JP | 2003-092181 A | 3/2003 |
| JP | 2003-168800 A | 6/2003 |
| JP | 2005-353589 A | 12/2005 |
| JP | 2007-516347 A | 6/2007 |
| JP | 2009025725 A * | 2/2009 |
| JP | 2009-272583 A | 11/2009 |
| JP | 2010-100674 A | 5/2010 |
| JP | 2010-135793 A | 6/2010 |
| JP | 2011-52064 A | 3/2011 |
| JP | 2011-113967 A | 6/2011 |
| JP | 2012-533152 A | 12/2012 |
| JP | 2013-080876 A | 5/2013 |
| KR | 10-2011-0058123 A | 6/2011 |
| WO | 2009/107429 A1 | 9/2009 |

OTHER PUBLICATIONS

Oxford Instruments, "Tantalum Pentoxide (Ta2O5) Atomic Layer Deposition (ALD)", downloaded from URL<https://www.oxford-instruments.com/products/etching-deposition-and-growth/processes/deposition-processes/metal-oxides/Ta2O5-ald> on Nov. 16, 2016.*

ChemNET.com, the physical and chemical property of 2373-98-0, 3,3'-Dihydroxybenzidine, downloaded from URL<http://www.chemnet.com/cas/en/2373-98-0/3,3-Dihydroxybenzidine.html> on Nov. 16, 2016.*

ChemNet.com, the physical and chemical property of 341-58-2, 2,2'-bis(trifluoromethyl)benzidine is provided by ChemNet.com downloaded from URL <http://www.chemnet.com/cas/en/341-58-2/TFMB.html> on Nov. 16, 2016.*

ChemicalBook.com, 1-6HeaneDiamine, downloaded from URL<http://www.chemicalbook.com/chemicalproductproperty_en_cb7204696.htm> on Nov. 16, 2016.*

Liaw, Der-Jang, Kung-Li Wang, Ying-Chi Huang, Kueir-Rarn Lee, Juin-Yih Lai, and Chang-Sik Ha. "Advanced Polyimide Materials: Syntheses, Physical Properties and Applications." Progress in Polymer Science 37.7 (2012): 907-74.*

Chang Chen. "Flexible Nanocrystalline-titania/polyimide Hybrids with High Refractive Index and Excellent Thermal Dimensional Stability." Journal of Polymer Science Part A: Polymer Chemistry 48.6 (2010): 1433-440.*

Hasegawa, Masatoshi, Yuki Hoshino, Natsumi Katsura, and Junichi Ishii. "Superheat-resistant Polymers with Low Coefficients of Thermal Expansion." Polymer 111 (2017): 91-102.*

Machine Translation of JP 2009/025725.*

Groner, M. D., et al.,"Gas diffusion barriers on polymers using Al2O3 atomic layer deposition," Applied Physics Letters, 88, 051907, 2006, 4 pages.

Triani, G., et al., "Atomic layer deposition of TiO2/Al2O3 films for optical applications," Proc. Of SPIE, vol. 5870, 587009-2, 10 pages.

* cited by examiner

SUBSTRATE FOR ORGANIC ELECTRONIC DEVICE

This application is a National Stage Entry of International Application No. PCT/KR2014/009240, filed Sep. 30, 2014, and claims the benefit of and priority to Korean Application No. 10-2013-0116617, filed Sep. 30, 2013 and Korean Application No. 10-2014-0131911, filed Sep. 30, 2014, all of which are incorporated by reference in their entirety for all purposes as if fully set forth herein.

FIELD

The present application relates to a substrate for an organic electronic device (OED) and a use thereof.

BACKGROUND

An OED such as an organic light emitting device (OLED), an organic photovoltaic cell, an organic photo conductor (OPC), or an organic transistor includes an organic material layer vulnerable to an external factor such as water. For this reason, structures capable of protecting an OED from an external material are suggested in the patent documents 1 to 4.

In a flexible structure to which a plastic substrate vulnerable to permeation of an external material is applied, a layer such as a barrier layer may be further included. Conventionally, the barrier layer is realized of an inorganic material. An OED including the barrier layer has a structure in which an organic material layer such as a plastic substrate and an inorganic material layer are present together. Since the inorganic material layer and the organic material layer generally have different thermal expansion characteristics, a stress may be easily generated from an inside of the device, and may be more highly generated when the flexible device is bent.

PRIOR ART DOCUMENT

Patent Documents

PATENT DOCUMENT 1: U.S. Pat. No. 6,226,890
PATENT DOCUMENT 2: U.S. Pat. No. 6,808,828
PATENT DOCUMENT 3: Japanese Patent Laid-Open Application No. 2000-145627
PATENT DOCUMENT 4: Japanese Patent Laid-Open Application No. 2001-252505

DESCRIPTION

Object

In a structure in which an organic material layer and an inorganic material layer are present together, due to a stress generated as described above, interlayer delamination easily occurs, which has a bad influence on durability of an OED. Accordingly, the present application is directed to providing a substrate for an OED not causing such a problem. The present application is also directed to providing an OED using the substrate for an OED to have excellent durability and an excellent required physical property such as light extraction efficiency.

Solution

In one aspect, an illustrative substrate for an OED may include a base film and an inorganic material layer. Here, the inorganic material layer may be formed on one surface of the base film. In the substrate for an OED, the base film and the inorganic material layer may have an excellent interfacial cohesive property, thereby preventing delamination caused by a change in surrounding environment or bending.

In the present application, a specific base film is applied as a base film to provide the substrate having an excellent cohesive property.

That is, the illustrative substrate for an OED may include a polyimide film, particularly, a hydroxyl group-introduced polyimide film, as a base film. Such a hydroxyl group-introduced polyimide film may have an excellent interfacial cohesive property to the inorganic material layer, particularly, an inorganic material layer (hereinafter, can be referred to as an ALD layer) formed by atomic layer deposition (ALD). The hydroxyl group-introduced polyimide film may exhibit a contact angle of approximately 65 degrees or less. As the hydroxyl group is introduced to ensure the above range of the contact angle, the base film may have an excellent adhesive property to the inorganic material layer. In the present application, the contact angle of the base film may also be adjusted in a range of approximately 50 degrees or more or approximately 55 degrees or more.

A polyimide is prepared by preparing a polyamic acid through a condensation reaction of tetracarboxylic acid dianhydride and a diamine compound, and imidizing the amic acid. Accordingly, the polyimide base film of the present application may also include a condensation unit (that is, a polyamic acid unit) of the dianhydride and the diamine compound, or an imidization unit (that is, a polyimide unit) thereof.

To introduce a hydroxyl group to the polyimide film, the polyamic acid unit or polyimide unit may include at least one hydroxyl group. Such a hydroxyl group may be substituted to at least one of the dianhydride or the diamine compound. Such a hydroxyl group may be substituted to at least one of the dianhydride or the diamine compound. An amount of the hydroxyl groups included in the unit is adjusted to ensure the above-described contact angle, and is not particularly limited. In one example, the unit may include 2 to 10, 2 to 9, 2 to 8, 2 to 7, 2 to 6, 2 to 5, 2 to 4 or 2 to 3 moles of the hydroxyl group.

A type of the dianhydride or diamine compound for forming a polyimide and a method of forming the unit using the same are not particularly limited. Various dianhydrides or diamine compounds for synthesizing a polyimide are known in a polyimide-relating field, and the polyimide may be formed by selecting a component having a desired hydroxyl group from the known components, or introducing a hydroxyl group using a suitable chemical reaction.

For example, as an aliphatic, alicyclic or aromatic tetracarboxylic acid dianhydride which can be used as the dianhydride, butane tetracarboxylic acid dianhydride, pentane tetracarboxylic acid dianhydride, hexane tetracarboxylic acid dianhydride, cyclopentane tetracarboxylic acid dianhydride, bicyclopentane tetracarboxylic acid dianhydride, cyclopropanetetracarboxylic acid dianhydride, methylcyclohexanetetracarboxylic acid dianhydride, 3,3',4,4'-benzophenonetetracarboxylic acid dianhydride, 3,4,9,10-perylenetetracarboxylic acid dianhydride, 4,4'-sulfonyldiphthalic dianhydride, 3,3',4,4'-biphenyltetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6,-pyridine tetracarboxylic acid dianhydride, m-terphenyl-3,3', 4,4'-tetracarboxylic acid dianhydride, p-terphenyl-3,3',4,4'-tetracarboxylic acid dianhydride, 4,4'-oxydiphthalic dianhydride, 1,1,1,3,3,3-hexafluoro-2,2-bis[(2,3 or 3,4-dicarboxyphenoxy)phenylpropane dianhydride, 2,2-bis[4-(2,3- or 3,4-dicarboxyphenoxy)phenyl]propane dianhydride, or 1,1,1,3,3,3-hexafluoro-2,2-bis[4-(2,3- or 4-dicarboxyphenoxy)phenyl]propane dianhydride may be used, as an aromatic, aliphatic or alicyclic diamine compound, an aromatic diamine such as p-phenylenediamine (PDA), m-phenylenediamine (m-PDA), 2,4,6-trimethyl-1,3-phenylenediamine, 2,3,5,6-tetramethyl-1,4-phenylenediamine, 4,4'-diaminodiphenylether, 3,4'-diaminodiphenylether, 3,3'-diaminodiphenylether, 4,4'-diaminodiphenylsulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, 2,2-bis[4-(3-aminophenoxy)phenyl]propane, 2,2-bis[4-(4-aminophenoxy)phenyl]propane(6HMDA), 2,2'-bis(trifluoromethyl)-benzidine(2,2'-bis(trifluoromethyl)benzidine, TFMB), 3,3'-bis(trifluoromethyl)-4,4'-diaminobiphenyl(3,3'-TFDB), 4,4'-bis(3-aminophenoxy)diphenylsulfone (DBSDA), bis(3-aminophenyl)sulfone (3DDS), bis(4-aminophenyl)sulfone (4DDS), 1,3-bis(3-aminophenoxy)benzene (APB-133), 1,4-bis(4-aminophenoxy)benzene (APB-134), 2,2'-bis[3(3-aminophenoxy)phenyl]hexafluoropropane (3-BDAF), 2,2'-bis[4(4-aminophenoxy)phenyl]hexafluoropropane (4-BDAF), 2,2'-bis(3-aminophenyl)hexafluoropropane (3,3'-6F), 2,2'-bis(4-aminophenyl)hexafluoropropane (4,4'-6F) or 4,4'-oxydianiline (ODA); or an aliphatic diamine such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, 4,4'-diamino-3,3'-dimethyldicyclohexylmethane, 4,4'-diamino-3,3'-dimethyldicyclohexylmethane, 1,2-bis-(2-aminoethoxy)ethane, bis(3-aminopropyl)ether, 1,4-bis(3-aminopropyl)piperazine, 3,9-bis(3-aminopropyl)-2,4,8,10-tetraoxaspiro[5.5]-undecane, or 1,3-bis(3-aminopropyl)tetramethyldisiloxane may be used, but the present application is not limited thereto. The dianhydride or diamine compound may be substituted by at least one hydroxyl group.

When needed, as at least two units are included in the polyimide base film, at least one of a haze and a refractive index may be adjusted. In this case, the polyimide base film may include a copolymer including a first unit which is a condensation unit of a first tetracarboxylic acid dianhydride and a first diamine compound or an imidization unit thereof, and a second unit which is a condensation unit of a second diamine compound or an imidization unit thereof.

In the base film, the first and second units may be included in one polymer, or in different polymers. That is, the base film may include a copolymer including the first unit and the second unit, or a polymer including the first unit and a polymer including the second unit. In addition, each of the first and second units may be a chain included in a predetermined polymer, or a polymer.

To control at least one of the haze and the refractive index, the first and second units may have different physical properties from each other. For example, the first and second units may have different refractive indexes from each other. The term "refractive index" used herein is, unless particularly defined otherwise, a refractive index measured with respect to light having a wavelength of 550 nm. For example, the absolute value of the difference in refractive index between the first unit and the second unit may be 0.01 or more. In another example, the absolute value of the difference in refractive index may be approximately 0.02, 0.03, 0.04, 0.05 or 0.06 or more. The absolute value of the difference in refractive index may be approximately 0.2, 0.15, 0.1 or 0.08 or less. A method of adjusting the refractive indexes of the first and second units is not particularly limited, and may be adjusted, for example, by adjusting a component for constituting each unit. For example, as described above, the dianhydride and diamine compound for forming the unit may be selected from aromatic, aliphatic or alicyclic dianhydride or diamine compounds. When an aromatic compound known to conventionally provide a high refractive index is selected, a unit having a relatively high refractive index may be formed.

In another example, the first and second units may have different polarities. For example, an either one or both of the first and second units may include at least one polar functional group. In this case, the absolute value of the difference between a mole number of polar functional groups included in the first unit and a mole number of polar functional groups included in the second unit may be 2 or more. The absolute value of the difference in mole number may be, in another example, 10, 8, 6, or 4 or less. The polar functional group may be substituted to the above-described dianhydride or diamine compound. A type of the polar functional group to be applied may be, but is not particularly limited to, a halogen atom such as fluorine or chlorine, a haloalkyl group substituted by a halogen such as fluorine or chlorine, a cyano group, a nitro group, a hydroxyl group, an alkoxy group, a cyanate group or a thiocyanate group, and in terms of convenience of the application, a halogen atom or a haloalkyl group. Here, the haloalkyl group or an alkoxy group may be a haloalkyl or alkoxy group having 1 to 20, 1 to 16, 1 to 12, 1 to 8 or 1 to 4 carbon atoms. Various dianhydrides or diamine compounds substituted with the above-described polar functional group may be known, or synthesized by conventional methods.

A haze of the polyimide base film may be uniformly adjusted using a difference in refractive index or polarity between the first and second units. A mixture of different types of polyimide having different refractive index or polarity may form an opaque emulsion, and it is considered that opacity of the emulsion is transferred to the film. Accordingly, as the difference in the refractive index or polarity of the component for forming the emulsion is adjusted, the haze of the polyimide film may be adjusted. In addition, as a ratio of the unit having a high refractive index is adjusted in this process, the refractive index of the entire film may also be easily adjusted. As the haze is given by a polymer unit itself, not by a method of giving a haze using conventional scattering particles, the polymer may have an excellent surface smoothness as well as the uniform haze.

Ratios of the first and second units in the base film may be adjusted in consideration of desired refractive index and haze without particular limitation. For example, the base film may include approximately 3 to 100, 3 to 80, 3 to 60, 3 to 40, 3 to 20 or 3 to 15 parts by weight of the first unit with respect to 100 parts by weight of the second unit, but the present application is not limited thereto.

A type of the dianhydride or diamine compound for forming the polyimide including the first and second units and a method of forming the unit using the same are not particularly limited, and for example, a suitable type of the above-described dianhydrides or diamine compounds may be selected and applied.

The base film may be a light-transmitting film. The term "light-transmitting film" may refer to a film having a transmittance for any one light in a visible region or light in the entire visible region of, for example, 50, 60, 70 or 80% or more.

When the base film is manufactured to have a haze as described above, the base film may have a haze in a range of, for example, 3 to 90%. Another lower limit of the haze may be, for example, approximately 5 or 10%. In addition, another upper limit of the haze may be, for example, approximately 85, 80, 75, 70, 65, 60, 55, 50, 45, 40, 35, or 30%. A method of providing a haze to the substrate may be, but is not particularly limited to, a method of adjusting a unit for forming a polyimide as described above, or blending suitable scattering particles in the base film.

The base film may have a coefficient of thermal expansion (CTE) in a range of approximately 5 to 70 ppm/° C. This range may be advantageous to prevent a defect of interlayer delamination which can occur in the structure in which an organic material layer and an inorganic material layer are present together.

The base film may have a glass transition temperature of approximately 200° C. or more. Such a glass transition temperature may be a glass transition temperature of the base film, or a glass transition temperature of the base film on which a buffer layer to be described below is formed. Such a range may be suitable for a high temperature process for deposition or patterning in a process of manufacturing an OED. The glass transition temperature may be, in another example, approximately 210, 220, 230, 240 or 250° C. or more. The upper limit of the glass transition temperature may be, but is not particularly limited to, for example, approximately 400, 350 or 300° C.

In the base film, a root mean square (RMS) may be adjusted within a range of approximately 0.1 to 5 nm. Such an RMS may be that for a surface of the base film, or that for a surface of a buffer layer to be described below of the base film. The range of the surface roughness may be advantageous to improve performance of a layer formed thereon. For example, when an inorganic material layer having a barrier property is formed on the base film, the inorganic material layer is formed on a surface having an RMS in the above range, a layer having an excellent water barrier property may be formed. The RMS may be, in another example, approximately 4, 3, 2.5 or 2 nm or less.

The base film may have a refractive index of approximately 1.5, 1.6, 1.7, 1.75 or 1.8 or more. A range of the refractive index of the base film in the OED may be advantageous to increase luminous efficiency of the device. The upper limit of the refractive index of the base film may be, but is not particularly limited to, for example, approximately 2.0.

The high refractive index of the base film may be achieved by selection of a component having a high refractive index which is the same as an aromatic compound as the dianhydride or diamine compound, or blending a suitable amount of a component having a high refractive index in the film during the manufacture of the base film.

A thickness of the base film may be selected in a suitable range in consideration of desired performance, for example, flexibility, light extraction efficiency or a barrier property without particular limitation. For example, the base film may have a thickness of approximately 10 to 50 μm or 20 to 30 μm.

An inorganic material layer is present on the base film. The term "inorganic material layer" used herein may be, for example, a layer including 50% or more or 60% of an inorganic material based on a weight. The inorganic material layer may include only an inorganic material, or another component such as an organic material as long as it includes an inorganic material in the above range.

The inorganic material layer may be, for example, a barrier layer. The term "barrier layer" used herein may be layer capable of preventing, inhibiting, or reducing the permeation of an external factor, for example, water or vapor, which can have a bad influence on the performance of the device such as an organic layer. For example, the barrier layer may have a water vapor transmission rate (WVTR) of $10^{-4}$ g/m$^2$/day or less. In the specification, the WVTR may be a value measured using a measurer (for example, PERMATRAN-W3/31, MOCON, Inc.) at 40° C. and a relative humidity of 90%.

The barrier layer may be formed of any one of the materials known to reduce, prevent, or inhibit the permeation of the external factors such as water and oxygen. The material may be a material known as a metal such as In, Sn, Pb, Au, Cu, Ag, Al, Ti, or Ni; a metal oxide such as TiO, TiO$_2$, Ti$_3$O$_3$, Al$_2$O$_3$, MgO, SiO, SiO$_2$, GeO, NiO, CaO, BaO, Fe$_2$O$_3$, Y$_2$O$_3$, ZrO$_2$, Nb$_2$O$_3$, or CeO$_2$; a metal nitride such as SiN; a metal oxynitride such as SiON; a metal fluoride such as MgF$_2$, LiF, AlF$_3$, or CaF$_2$; an absorbing material having an absorbance of 1% or more or a water-proof material having an absorption coefficient of 0.1% or less.

The inorganic material layer may be formed to have low crystallinity. Such a degree of crystallinity may contribute to the manufacture of the above-described substrate having an interfacial cohesive property. In addition, when the inorganic material layer has low crystallinity, for example, a function as the barrier layer is required for the inorganic material layer, the permeation of water and external material at an interface of crystal components present in the inorganic material layer may be effectively prevented. When formed by a general deposition method, the inorganic material layer has high probability of crystallization due to a property of the material, and thus is not easy to satisfy the above-described degree of crystallization. However, the inorganic material layer satisfying the above-described degree of crystallization by employing any one of a method of forming an inorganic material layer using an oxide layer such as a metal oxide, a method of repeatedly forming a thin layer, a method of adjusting that each sub layer is formed of a different material during the repeatedly forming the thin layers, and a method of forming each sub layer using a different material, however, all of the sub layers being formed as oxide layers such as metal oxide layers.

It is suitable that the inorganic material layer may have a small difference in refractive index from the base film. In this case, particularly, it can contribute to formation of a substrate having excellent light extraction efficiency. For example, the absolute value of the difference in refractive index between the inorganic material layer and the base film may be approximately 1, 0.7, 0.5, or 0.3 or less. Accordingly, when the base film has a high refractive index as described above, the inorganic material layer may also have a refractive index at the same level. For example, the refractive index of the barrier layer may be approximately 1.5, 1.6, 1.7, or 1.75 or more. When the OED to which the substrate of the present application is applied is an OLED, the range of the refractive index of the base film may be advantageous to increase the luminous efficiency of the device. The upper limit of the refractive index of the inorganic material layer may be, for example, but is not particularly limited to, approximately 2.0.

A thickness of the inorganic material layer may be determined according to an effect caused by a desired use, and in one example, the range of the thickness may be, but is not particularly limited to, approximately 10 to 100, 1 to 90, 10 to 80, 1 to 70, 10 to 60, 10 to 50, or 20 to 50 nm.

While the inorganic material layer may have a monolayer or multilayer structure, it may be required to have a multilayer structure to satisfy the above-described degree of crystallization. The multilayer structure may include a structure in which the same type or different types of inorganic material layers are stacked. The formation of the inorganic material layer in a multilayer structure may contribute to the formation of an inorganic material layer having the above-described interface cohesive property and having the above-described degree of crystallization. In addition, the formation of the inorganic material layer in a multilayer structure may contribute to the formation of an inorganic material layer having the above-described refractive index.

The inorganic material having a multilayer structure may include at least a stack structure of a first sub layer and a second sub layer. In consideration of the interfacial cohesive property, the degree of crystallization, the barrier property or the refractive index required by the inorganic material layer, thicknesses of the first and second sub layers may be adjusted. For example, the thicknesses of the first and second sub layers may all be adjusted in a range of 7, 6, 5, 4, 3 or 2 nm or less. The lower limit of the thickness of the sub layer is not particularly limited. As the thickness of the sub layer is smaller, the contribution to the adjustment of the interfacial cohesive property, the degree of crystallization, the barrier property and the refractive index may be increased, and when the thickness of the sub layer is smaller, a required number of processes may be increased to reach a desired thickness. Accordingly, the lower limit of the thickness of the sub layer may be determined in a suitable range according to a desired thickness, etc., and may be adjusted to approximately 0.1 nm or more.

In consideration of the interfacial cohesive property, the degree of crystallization, the barrier property and the refractive index, the thicknesses of all sub layers included in the inorganic material layer having a multilayer structure may be adjusted in the above range. In this case, the inorganic material layer may not include a sub layer having a thickness of more than 10, 9, 8, 7, 6 or 5 nm.

The number of the sub layers included in the inorganic material layer is not limited. It may be adjusted according to the thickness of the sub layer and the thickness of the desired inorganic material layer. In one example, the inorganic material layer may include 2 to 50 sub layers. In this range, 4, 6, 8 or 10 or more sub layers may be included. In addition, in this range, 45, 40, 35, 30, 25, 20 or 15 or less sub layers may be included. When the inorganic material layer includes 3 or more sub layers, all of the sub layers may be the first or second sub layers, and in addition, a third sub layer or a higher sub layer may be included.

The sub layer may be formed of one of various materials, and may be formed of an oxide, a nitride or an oxynitride of various metals or non-metals to contribute to the interfacial cohesive property, the degree of crystallization, the barrier property and the refractive index. Accordingly, the first and second sub layers may be oxide layers, nitride layers or oxynitride layers. When needed, all of the sub layers included in the inorganic material layer may be formed of the oxide. A type of the oxide capable of being used in this case may be suitably selected from an oxide capable of forming the above-described barrier layer without particular limitation. Among the sub layers, sub layers in contact with each other may contribute to the interfacial cohesive property, the degree of crystallization, the barrier property and the refractive index as long as the sub layers are formed of different materials. Accordingly, when the first and second sub layers are in contact with each other, the different materials may be, for example, different oxides, nitrides or oxynitrides. Even though the inorganic material layer includes a third sub layer, a fourth sub layer or a higher sub layer as described above, it is advantageous that the sub layers in contact with each other may be formed of a different material, for example, a different oxide.

The first sub layer may have a first refractive index, and the second sub layer may have a second refractive index different from the first refractive index. When such a layer is stacked, it is advantageous that the above-described effect may be ensured and the refractive index of the inorganic material layer may be adjusted in the above range. The absolute value of the difference between a first refractive index and a second refractive index may be, for example, 0.1 or more. The absolute value may be, in another example, 0.2, 0.3, 0.4, 0.5 or 0.6 or more. In addition, the absolute value may be, in another example, in a range of 2, 1.8, 1.6, 1.4 or 1.2 or less. The ranges of the first and second refractive indexes are not particularly limited, as long as they are in the above range, but for example, the refractive index of the first sub layer may be in a range of 1.4 to 1.9, and the refractive index of the second sub layer may be in a range of 2.0 to 2.6. The first and second sub layers may be metal oxide layers. For example, a suitable material of the first sub layer may be $Al_2O_3$, a suitable material of the second sub layer may be $TiO_2$. As long as the above range of refractive index may be obtained and a final stack structure may have a barrier property, various materials may be applied.

The inorganic material layer or each sub layer may be formed by a known method, but to ensure the interface cohesion, it is advantageous that the inorganic material layer or each sub layer is formed by atomic layer deposition (ALD). The ALD may include a process of alternately depositing a precursor such as an organic metal and a precursor such as water on a surface to be adhered, and in this process, monolayers of the precursors may be alternately formed and reacted with each other. When a predetermined functional group, for example, the above-described hydroxyl group, is included in the base film, a layer formed by the ALD may react with the functional group during the formation, thereby ensuring the desired interfacial cohesive property.

A method of forming an inorganic material layer or a sub layer which can be applied, other than the ALD, may include physical vapor deposition (PVD) such as sputtering, pulsed laser deposition (PLD), electron beam evaporation, thermal evaporation, or laser molecular beam epitaxy (L-MBE), or a chemical vapor deposition (CVD) such as metal organic chemical vapor deposition (MOCVD), hydride vapor phase epitaxy (HVPE), initiated chemical vapor deposition (iCVD), or plasma enhanced chemical vapor deposition (PECVD). When needed, a suitable one of the above methods may be selected according to a material to be used, thereby maximizing performance of the inorganic material layer.

The substrate of the present application may include an additional layer. For example, the substrate of the present application may further include a buffer layer between the inorganic material layer and the base film to achieve an interfacial cohesive property between the inorganic material layer and the base film. However, the buffer layer is not a necessary component, and for example, as long as the interfacial cohesive property is achieved, the buffer layer may not be required.

The substrate of the present application may further include an electrode layer present on the inorganic material layer.

As an electrode layer, a hole injection or electron injection electrode layer conventionally used in the OED may be used. The electrode layer may be a transparent electrode layer, or a reflective electrode layer.

The hole injection electrode layer may be formed of, for example, a material having a relatively high work function, and when needed, may be formed of a transparent or reflective material. For example, the hole injection electrode layer may include a metal, an alloy, an electro conductive compound or a mixture of at least two thereof having a work function of approximately 4.0 eV or more. Such a material may be a metal such as gold, CuI, indium tin oxide (ITO), indium zinc oxide (IZO), zinc tin oxide (ZTO), aluminum- or indium-doped zinc oxide, magnesium indium oxide, nickel tungsten oxide, an oxide such as ZnO, $SnO_2$, or $In_2O_3$, a metal nitride such as gallium nitride, a metal selenide such as zinc selenide, or a metal sulfide such as zinc sulfide. A transparent hole injection electrode layer may also be formed of a stack of a metal thin film such as Au, Ag, or Cu and a high refractive transparent material such as ZnS, $TiO_2$, or ITO.

The hole injection electrode layer may be formed by an optional means such as deposition, sputtering, chemical deposition, or an electrochemical means. In addition, the electrode layer formed according to its use may be patterned through a known photolithography or a process using a shadow mask.

The electron injection electrode layer may be formed, for example, using a material having a relatively low work function, and may be formed using a suitable transparent or reflective material among the materials used to form the hole injection electrode layer, but the present application is not limited thereto. The electron injection electrode layer may also be formed by, for example, deposition or sputtering, or may be suitably patterned when needed.

The electrode layer may be formed to have a thickness of, for example, approximately 90 to 200, 90 to 180, or 90 to 150 nm.

In another aspect, the present application provides an OED. The OED may include the above-described substrate for an OED, and a device region having a first electrode layer, an organic material layer, and a second electrode layer, which are present on an inorganic material layer of the substrate. When the substrate for an OED includes the above-described electrode layer, the electrode layer may serve as the first electrode layer.

The illustrative OED may include the substrate including the base film and the inorganic material layer, a first electrode layer, an organic material layer, a second electrode layer, a second inorganic material layer, and a cover film, which are sequentially present in an upper direction. The layers may be directly stacked without another layer between adjacent layers, or may be stacked by means of another layer.

The term "upper direction" used herein refers to, unless particularly defined otherwise, a direction from the first electrode layer to the second electrode layer, and the term "bottom direction" used herein refers to a direction from the second electrode layer to the first electrode layer.

Hereinafter, in the specification, for convenience of the description, in the above structure, a region including all of the factors present under the first electrode layer (excluding the first electrode layer) is called as a substrate region, a region including the first electrode layer, the second electrode layer, and all of the factors present therebetween is referred to as a device region, and a region including all of the factors (excluding the second electrode layer) present on the second electrode layer is referred to as an upper region.

The substrate region may include an additional layer in addition to the above-described base film. As the layer additionally present in the substrate region, a carrier substrate, a barrier film, or an adhesive layer may be used.

As another layer capable of being included in the substrate region, a barrier film may be used. Compared to a rigid structure using a substrate having an excellent barrier property of the properties of the material such as a glass substrate, in a flexible structure, a base film having a relatively low barrier property may be applied, and therefore, an additional barrier film may be present, for example, under the base film to compensate the barrier property. As the barrier film, a film which can ensure a suitable barrier property and transmittance when needed may be used without particular limitation.

The barrier film may be adhered to the base film, for example, using an adhesive layer. Here, the barrier film may be adhered to an opposite side of the surface on which the inorganic material layer is formed of the base film. The term "adhesive layer" used herein includes materials conventionally called as an adhesive, and layers formed using a material called as a pressure-sensitive adhesive and a material called as a pressure-sensitive adhesive/adhesive. The material for forming the adhesive layer may be, but is not particularly limited to, for example, a known pressure-sensitive adhesive/adhesive material such as an acrylic polymer, a silicon polymer, a rubber-based polymer, an ethylene vinyl acetate (EVA) polymer, or an olefin polymer such as polyisobutylene (PIB).

A suitable water-proof material may be blended in the adhesive layer. Hereinafter, the term "adhesive layer blended with the water-proof material" used herein may be an adhesive layer having a barrier property. The term "water-proof material" used herein may be used as a component which can adsorb or remove water or vapor introduced from an external environment through a physical or chemical reaction. A specific type of the water-proof material which can be blended with the adhesive layer may be, but is not particularly limited to, one or a mixture of at least two of, for example, a metal oxide, an organic metal oxide, a metal salt, and phosphorus pentoxide ($P_2O_5$). Here, a specific example of the metal oxide may be, but is not limited to, lithium oxide ($Li_2O$), sodium oxide ($Na_2O$), barium oxide (BaO), calcium oxide (CaO), or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide (BaI$_2$), or magnesium iodide (MgI$_2$); or a metal chlorate such as barium perchlorate (Ba(ClO$_4$)$_2$) or magnesium perchlorate (Mg(ClO$_4$)$_2$).

Suitable scattering particles may be blended in the adhesive layer, and thus the adhesive layer may exhibit a suitable haze. When the adhesive layer exhibits a haze, light extraction efficiency may be improved. A type of the scattering particles which can be blended in the adhesive layer is not particularly limited, and a suitable type of the scattering particles included in the scattering layer may be selected in consideration of the refractive index of a resin for forming the adhesive layer.

As another layer which may be present in the substrate region, a carrier substrate which may be temporarily or permanently adhered under the base film may be used. Conventionally, as the carrier substrate, a rigid substrate such as a glass substrate may be applied.

The substrate region may be formed in various structures. For example, the substrate region may have a structure in which the inorganic material layer and a base film are sequentially formed in a bottom direction, a structure in which the above-described buffer layer or scattering layer is formed between the inorganic material layer and a base film, or a structure in which a carrier film or a barrier film is adhered under the base film by an adhesive layer when needed.

An organic material layer is present between the first and second electrode layers. The organic material layer may include at least one or two emitting units. In such a structure, light generated from the emitting unit may be emitted to a transparent electrode layer through reflection by a reflective electrode layer.

When at least two emitting units are present, for suitable emission, an intermediate electrode layer or charge-generating layer (CGL) may be further present between the plurality of emitting units. Accordingly, the emitting units may be divided by the intermediate electrode layer or CGL having a charge-generating characteristic.

A material constituting the emitting unit is not particularly limited. Fluorescent or phosphorescent organic materials having various emission center wavelengths are known in the art, and a suitable type of the known materials may be selected to form the emitting unit. The material for the emitting unit may be, but is not limited to, an Alq-based material such as tris(4-methyl-8-quinolinolate)aluminum (III) (Alg3), 4-MAlq3, or Gaq3; a cyclopentadiene derivative such as C-545T(C$_{26}$H$_{26}$N$_2$O$_2$S), DSA-amine, TBSA, BTP, PAP-NPA, spiro-FPA, PhTDAOXD (Ph$_3$Si), or 1,2,3,4,5-pentaphenyl-1,3-cyclopentadiene (PPCP); 4,4'-bis(2,2'-diphenylvinyl)-1,1'-biphenyl (DPVBi), distyrylbenzene, or a derivative thereof; 4-(dicyanomethylene)-2-tert-butyl-6-(1,1,7,7,-tetramethyljulolidyl-9-enyl)-4H-pyran (DCJTB), DDP, AAAP, or NPAMLI; or a phosphorescent material such as Firpic, m-Firpic, N-Firpic, bon$_2$Ir(acac), (C$_6$)$_2$Ir(acac), bt$_2$Ir(acac), dp$_2$Ir(acac), bzq$_2$Ir(acac), bo$_2$Ir(acac), F$_2$Ir(bpy), F$_2$Ir(acac), op$_2$Ir(acac), ppy$_2$Ir(acac), tpy$_2$Ir(acac), fac-tris[2-(4,5'-difluorophenyl)pyridine-C'2,N]iridium(III) (FIrppy), or bis(2-(2'-benzo[4,5-a]thienyl)pyridinato-N,C3') iridium(acetylactonate) (Btp$_2$Ir(acac)). The emitting unit may include the above material as a host, and a host-dopant system including perylene, distyrylbiphenyl, DPT, quinacridone, rubrene, BTX, ABTX, or DCJTB as a dopant.

The emitting unit may also be formed by employing a suitable one exhibiting an emission characteristic selected from electron accepting organic compounds or electron donating organic compounds, which will be described below.

The organic material layer may be formed in various structures further including various other functional layers known in the art, as long as it includes the emitting unit. As a layer capable of being included in the organic material layer, an electron injection layer, a hole blocking layer, an electron transport layer, a hole transport layer, or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene or phenanthrene, or a derivative thereof; or a heterocyclic compound such as phenanthroline, bathophenanthroline, phenanthridine, acridine, quinoline, quinoxaline or phenazine, or a derivative thereof may be used. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Patent Laid-Open Application No. 1988-295695, Japanese Patent Laid-Open Application No. 1996-22557, Japanese Patent Laid-Open Application No. 1996-81472, Japanese Patent Laid-Open Application No. 1993-009470, or Japanese Patent Laid-Open Application No. 1993-017764, for example, a metal complex having at least one of metal chelated oxinoid compounds such as 8-quinolinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in a patent publication such as Japanese Patent Laid-Open Application No. 1993-202011, Japanese Patent Laid-Open Application No. 1995-179394, Japanese Patent Laid-Open Application No. 1995-278124, or Japanese Patent Laid-Open Application No. 1995-228579; a triazine compound disclosed in a patent publication such as Japanese Patent Laid-Open Application No. 1995-157473; a stilbene derivative disclosed in a patent publication such as Japanese Patent Laid-Open Application No. 1994-203963; a distyrylarylene derivative; a styryl derivative disclosed in a patent publication such as Japanese Patent Laid-Open Application No. 1994-132080 or Japanese Patent Laid-Open Application No. 1994-88072; a diolefin derivative disclosed in a patent publication such as Japanese Patent Laid-Open Application No. 1994-100857 or Japanese Patent Laid-Open Application No. 1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine; a dimethylidine compound such as 1,4-phenylenedimethylidine, 4,4'-phenylenedimethylidine, 2,5-xylene dimethylidine, 2,6-naphthylenedimethylidine, 1,4-biphenylenedimethylidine, 1,4-para-terephenylene dimethylidine, 9,10-anthracenediyldimethylidine, or 4,4'-(2,2-di-ti-butylphenylvinyl)biphenyl or 4,4'-(2,2-diphenylvinyl) biphenyl or a derivative thereof; a silanamine derivative disclosed in a patent publication such as Japanese Patent Laid-Open Application No. 1994-49079 or Japanese Patent Laid-Open Application No. 1994-293778; a multifunctional styryl compound disclosed in a patent publication such as Japanese Patent Laid-Open Application No. 1994-279322 or Japanese Patent Laid-Open Application No. 1994-279323; an oxadiazole derivative disclosed in a patent publication such as Japanese Patent Laid-Open Application No. 1994-107648 or Japanese Patent Laid-Open Application No. 1994-092947; an anthracene compound disclosed in a patent publication such as Japanese Patent Laid-Open Application No. 1994-206865; an oxinate derivative disclosed in a patent publication such as Japanese Patent Laid-Open Application No. 1994-145146; a tetraphenyl butadiene compound disclosed in a patent publication such as Japanese Patent Laid-Open Application No. 1992-96990; an organic trifunctional compound disclosed in a patent publication such as Japanese Patent Laid-Open Application No. 1991-296595; a coumarin derivative disclosed in a patent publication such as Japanese Patent Laid-Open Application No. 1990-191694; a perylene derivative disclosed in a patent publication such as Japanese Patent Laid-Open Application No. 1990-196885; a naphthalene derivative disclosed in a patent publication such as Japanese Patent Laid-Open Application No. 1990-255789; a phthaloperynone derivative disclosed in a patent publication such as Japanese Patent Laid-Open Application No. 1990-289676 or Japanese Patent Laid-Open Application No. 1990-88689; or a styryl amine derivative disclosed in a patent publication such as Japanese Patent Laid-Open Application No. 1990-250292 may be used as an electron accepting organic compound included in the low refractive layer. In addition, here, the electron injection layer may be formed using, for example, a material such as LiF or CsF.

The hole blocking layer may be a layer capable of enhancing a lifespan and efficiency of the device by preventing approach of injected holes to an electron injection electrode layer through the emitting unit, and may be formed in a suitable part between the emitting unit and the electron injection electrode layer using a known material when needed.

The hole injection layer or hole transport layer may include, for example, an electron donating organic compound. As the electron donating organic compound, N,N', N'-tetraphenyl-4,4'-diaminophenyl, N,N'-diphenyl-N,N'-di (3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4"-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4"-bis[N-(1-anthryl)-N-phenylamino]-p-terphenyl, 4,4'-bis[N-(2-phenanthryl)-N-phenylamino]biphenyl, 4,4'-bis [N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino] naphthalene, 2,6-bis[N-(1-naphthyl)-N-(2-naphthyl)amino] naphthalene, 4,4"-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyl)amino]fluorene, or 4,4"-bis(N,N-di-p-tolylamino)terphenyl, or an aryl amine compound such as bis(N-1-naphthyl)(N-2-naphthyl)amine may be used, but the present application is not limited thereto.

The hole injection layer or hole transport layer may be formed by dispersing an organic compound in a polymer, or using a polymer derived from the organic compound. In addition, π-conjugated polymers such as polyparaphenylenevinylene and a derivative thereof, hole transport non-conjugated polymers such as poly(N-vinylcarbazole), or π-conjugated polymers such as polysilane may also be used.

The hole injection layer may be formed using an electrically-conductive polymer such as a metal phthalocyanine such as copper phthalocyanine or a non-metal phthalocyanine, a carbon film, and polyaniline, or may be formed by reaction with a Lewis acid using the aryl amine compound as an oxidizing agent.

A particular structure of the organic material layer is not particularly limited. Various materials and methods for forming a hole or electron injection electrode layer and an organic layer, for example, an emitting unit, an electron injection or transport layer, or a hole injection or transport layer are known in the art, and all of the methods may be applied to manufacture the OED.

An upper region of the OED may include an inorganic material layer and a cover film, which are sequentially formed in an upper direction. To discriminate the inorganic material layer from that of the substrate for an OED, the inorganic material layer included in the upper region may be referred to as a second inorganic material layer, and the inorganic material layer included in the substrate may be referred to as a first inorganic material layer.

The second inorganic material layer is present to prevent, inhibit, or reduce the permeation of external materials, thereby obtaining durability, and specific material and forming method may be similar to those described in the category of the first inorganic material layer. However, when the second inorganic material layer is designed to emit light to the substrate region, it is not necessary to form the second inorganic material layer to have a high refractive index, which is the same as that of the first inorganic material layer.

A cover film present on the second inorganic material layer may be a structure for protecting an OED, which is, for example, a known barrier film, metal sheet, or conductive film, or a stack structure of at least two thereof. The cover film in the upper region may be adhered to a top surface of the second inorganic material layer by an adhesive layer, for example, the above-described adhesive layer having a barrier property.

In still another aspect, the present application provides a use of the OED, for example, an OLED. The OLED may be effectively applied to a backlight of a liquid crystal display (LCD), lightings, sensors, a light source of a printer or copy machine, a light source for an automobile gauge, a signal light, a pilot lamp, a display device, a light source for a planar emitting device, a display, decorations, or other kinds of lights. In one example, the present application relates to a lighting device including the OLED. When the OLED is applied to the lighting device or for different uses, other components constituting the device or a method of constituting the device is not particularly limited, but all of optional materials or methods known in the corresponding field may be employed as long as the OLED is used.

Effect

According to the present application, a substrate can have excellent durability by preventing interlayer delamination occurring due to internal stress in a structure in which an organic material and an inorganic material are present together. In addition, as the substrate is used, an OED has excellent durability and an excellent another required physical property such as light extraction efficiency.

DETAILED DESCRIPTION OF ILLUSTRATIVE EMBODIMENTS

Hereinafter, illustrative embodiments of the present application will be described in detail with reference to examples according to the present application. However, the scope of the present application is not limited to the embodiments to be disclosed below.

Preparation Example 1. Manufacture of Polyimide Substrate (A)

A polyamic acid solution was synthesized through a condensation reaction of 3,3',4,4'-biphenyltetracarboxylic dianhydride (BPDA) and 1,3-diamino-4,6-dihydroxybenzene (DADHB) in a reactor. Subsequently, a polyimide substrate (A) was synthesized by spin-coating the solution on a glass substrate to have a thickness of approximately 20 µm, heating the resulting glass substrate in an oven at a rate of approximately 2° C./min, and maintaining the substrate at 80° C. for 15 minutes, at 150° C. for 30 minutes, at 220° C. for 30 minutes, and at 350° C. for 1 hour to perform imidization. A contact angle of the manufactured polyimide substrate with respect to deionized water was measured at approximately 61 degrees.

Preparation Example 2. Manufacture of Polyimide Substrate (B)

A polyamic acid solution was synthesized through a condensation reaction of BPDA and 1,3-diaminobenzene (DAB) in a reactor. Subsequently, a polyimide substrate (B) was synthesized by spin-coating the solution on a glass substrate to have a thickness of approximately 20 µm, heating the resulting glass substrate in an oven at a rate of approximately 2° C./min, and maintaining the substrate at 80° C. for 15 minutes, at 150° C. for 30 minutes, at 220° C. for 30 minutes, and at 350° C. for 1 hour to perform imidization. A contact angle of the manufactured polyimide substrate with respect to deionized water was measured at approximately 72 degrees.

Example 1

Figure 1:
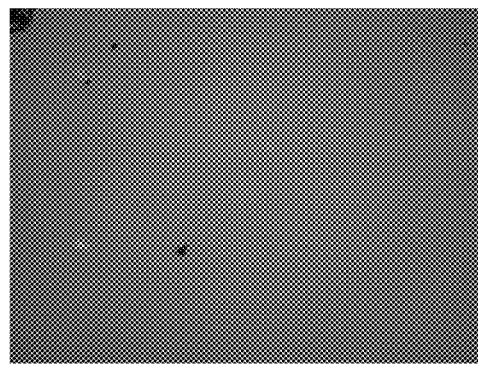
FIG. 1 is a diagram showing a result obtained by evaluating water permeability for a substrate manufactured in Example.

An OED was formed on the polyimide substrate (A) formed on the glass substrate manufactured in Preparation Example 1. First, a barrier layer was formed on the polyimide substrate (A). The barrier layer was formed to obtain a final refractive index of approximately 1.8 through ALD by alternately depositing an $Al_2O_3$ layer having a refractive index of approximately 1.6 to 1.8 in a single deposition and a $TiO_2$ layer having a refractive index of approximately 2.0 to 2.4 in a single deposition. The $Al_2O_3$ layer was formed by alternately adsorbing a trimethylaluminum layer as a precursor and a water ($H_2O$) layer through the known ALD at approximately 200° C., and the $TiO_2$ layer was also formed by alternately adsorbing a $TiCl_4$ layer as a precursor and a water ($H_2O$) layer through the known ALD at approximately 200° C. In this case, the barrier layer was formed to have a final thickness of approximately 40 nm by adjusting each of thicknesses of the $Al_2O_3$ layer and the $TiO_2$ layer to be in a range of approximately 2 to 5 nm. Subsequently, an OED was manufactured by forming a device region by sequentially forming a hole injection transparent electrode layer, hole transport layer, a first emitting unit having an emission wavelength within in a range of 380 to 500 nm, an n-type organic semiconductor layer, a p-type organic semiconductor layer, a second emitting unit having an emission wavelength within a range of approximately 500 to 700 nm, a hole block layer, an electron transport layer, an electron injection layer and an electron injection reflective electrode layer using known methods on the barrier layer, and encapsulating the device region with a suitable encapsulating material. The OED was maintained at 85° C., a relatively humidity of 85% for approximately 500 hours to confirm whether or not water was permeated into the OED, which is shown in FIG. 1. As confirmed from FIG. 1, according to the above-described method, water was not substantially permeated into the OED.

Comparative Example 1

Figure 2:
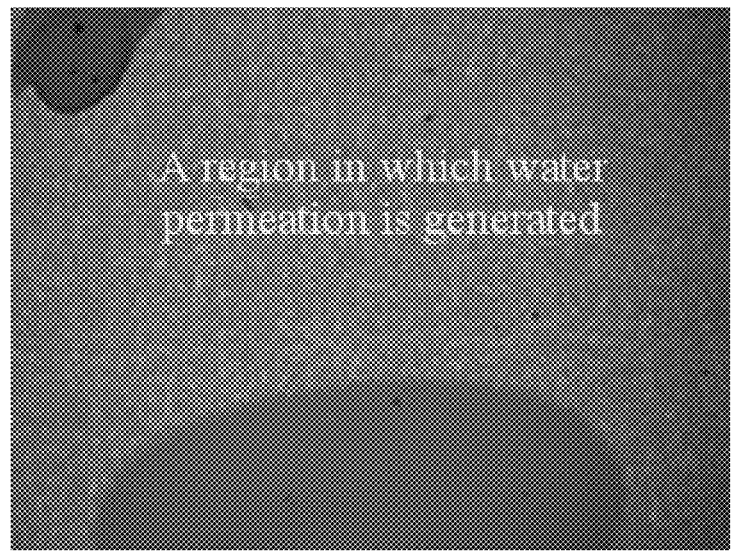
FIG. 2 is a diagram showing a result obtained by measuring water permeability for a substrate manufactured in Comparative Example.

An OED was formed by the same method as described in Example 1, except that the polyimide substrate (B) formed on the glass substrate and manufactured in Preparation Example 2 was used. The manufactured OED was maintained at 85° C., a relatively humidity of 85% for approximately 500 hours to confirm whether or not water was permeated into the OED, which is shown in FIG. 2. As confirmed from FIG. 2, according to the above-described method, the device had a wide water permeating region.

What is claimed is:

1. A substrate for an organic electronic device (OED), comprising:
 a base film including a condensation unit of an aromatic tetracarboxylic acid dianhydride and a diamine compound or an imidization unit thereof having two or more hydroxyl groups; and
 an inorganic material layer disposed on the base film, wherein the diamine compound is 1,3-diamino-4,6-dihydroxybenzene, and wherein a surface of the base film has a contact angle in a range of 50 to 65 degrees with respect to deionized water at room temperature.

2. The substrate according to claim 1, wherein the imidization unit includes 2 to 10 moles of a hydroxyl group.

3. The substrate according to claim 1, wherein the base film includes a first unit which is a condensation unit of a first aromatic tetracarboxylic acid dianhydride and the diamine compound or an imidization unit thereof and a second unit in which a condensation unit of a second aromatic tetracarboxylic acid dianhydride and the diamine compound or an imidization unit thereof.

4. The substrate according to claim 3, wherein the absolute value of the difference in refractive index between the first unit and the second unit is 0.01 or more.

5. The substrate according to claim 3, wherein the absolute value of the difference between a mole number of polar functional groups included in the first unit and a mole number of polar functional groups included in the second unit is 2 or more.

6. The substrate according to claim 5, wherein the polar functional group is a halogen atom, a haloalkyl group, a cyano group, a nitro group, an alkoxy group, a cyanate group or a thiocyanate group.

7. The substrate according to claim 3, wherein the base film includes 3 to 30 parts by weight of the first unit with respect to 100 parts by weight of the second unit.

8. The substrate according to claim 1, wherein the inorganic material layer is an atomic layer deposition (ALD) layer.

9. The substrate according to claim 1, wherein the inorganic material layer has a refractive index for light having a wavelength of 550 nm of 1.7 or more.

10. The substrate according to claim 1, wherein the inorganic material layer includes a stack structure of a first sub layer and a second sub layer.

11. The substrate according to claim 10, wherein each of the first sub layer and the second sub layer has a thickness of 7 nm or less.

12. The substrate according to claim 11, wherein the inorganic material layer does not include a layer having a thickness of more than 7 nm.

13. The substrate according to claim 10, wherein the first sub layer and the second sub layer are metal oxide layers.

14. The substrate according to claim 10, wherein the first sub layer has a refractive index of 1.4 to 1.9, and the second sub layer has a refractive index of 2.0 to 2.6.

15. An organic electronic device (OED), comprising:
the substrate for an OED of claim 1; and
a device region having a first electrode layer, an organic material layer, and a second electrode layer, which are present on an inorganic material layer of the substrate.

16. A light source for a display, comprising:
the OED of claim 15.

17. A lighting device, comprising:
the OED of claim 15.

18. The substrate according to claim 1, wherein the base film has a root mean square value of surface roughness in a range of 0.1 to 5 nm.

19. The substrate according to claim 1, further including a buffer layer between the inorganic material layer and the base film.

20. The substrate according to claim 1, wherein the aromatic tetracarboxylic acid dianhydride is 3,3',4,4'-biphenyltetracarboxylic dianhydride.

* * * * *